US006946889B2

(12) United States Patent
Le et al.

(10) Patent No.: US 6,946,889 B2
(45) Date of Patent: Sep. 20, 2005

(54) SELF ALIGNMENT SYSTEM FOR COMPLEMENT CLOCKS

(75) Inventors: Thoai-Thai Le, Cary, NC (US); George Alexander, Durham, NC (US); Guenter Gerstmeier, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 30 days.

(21) Appl. No.: 10/364,716

(22) Filed: Feb. 11, 2003

(65) Prior Publication Data

US 2004/0160253 A1 Aug. 19, 2004

(51) Int. Cl.[7] .................................................. G06F 1/04
(52) U.S. Cl. ....................................... 327/295; 327/170
(58) Field of Search ................................ 327/170, 172, 327/173, 174, 175, 176, 295, 296, 259, 258, 255, 256

(56) References Cited

U.S. PATENT DOCUMENTS 5,672,991 A * 9/1997 Thoma et al. .............. 327/239
6,583,656 B1 * 6/2003 Liu ............................ 327/170
6,653,881 B2 * 11/2003 Truong et al. .............. 327/259

FOREIGN PATENT DOCUMENTS

JP 64-073815 * 3/1989 ............ H03K/5/15

OTHER PUBLICATIONS

M. Morris Mano, Digital Logic and Computer Design, Prentice Hall, Inc., 1977; Figs. 13–22, pp 585.*

* cited by examiner

*Primary Examiner*—Linh My Nguyen
(74) *Attorney, Agent, or Firm*—Brinks Hofer Gilson & Lione

(57) ABSTRACT

A self-alignment system for complement clock signals includes a first delay circuit and a second delay circuit. A first clock signal may be propagated through the first delay circuit and a second clock signal may be propagated through the second delay circuit. A propagation delay of each of the first and second delay circuits may be selectively varied as a function of the first and second clock signals.

28 Claims, 7 Drawing Sheets

SELF ALIGNMENT SYSTEM FOR COMPLEMENT CLOCKS

BACKGROUND OF THE INVENTION

1. Technical Field

The present invention relates generally to clocks in electronic circuits, and more particularly, to a system for self alignment of complement clocks.

2. Related Art

The use of clock signals to control the timing of operations in electronic circuits is well known. Stability of the clock signals is important to the proper operation of digital systems. In digital systems with complement clock signals, such as delay locked loop (DLL) circuits in double data rate-synchronous dynamic access random access memory (DDR SDRAM) stability is especially important to maintain alignment of the clock signals. Ideally, complement clock signals in such a digital system should have the same slew rate, the same duty cycle and remain phase shifted by exactly 180 degrees. In reality, since the clock signals are distributed over the area of a semiconductor chip, the alignment of complement clock signals is difficult to maintain over the whole chip. Difficulties are mainly the result of routing constraints and semiconductor process variations.

Accordingly, in digital circuits such as DLL circuits, complement clock signals have to be redriven. One simple way to redrive complement clock signals is by passing each of the clock signals through a separate series of inverters. The more inverters placed in respective inverter chains, the larger the amount of delay imposed on the complement clock signals passing therethrough. The drawback of using inverter chains is that mismatches of the complement clock signals that are present at the inputs to the inverter chains usually propagate to the outputs. In addition, the magnitude of the mismatch may be increased by the inverter chains.

SUMMARY

The present invention includes a self-alignment system for correcting mismatches in the timing of complement clock signals to maintain a desired phase shift between the complement clock signals. The self-alignment system includes a first delay circuit capable of delaying a first clock signal and a second delay circuit capable of delaying a second clock signal. The delay of the first and second clock signals is independently varied by the respective first and second delay circuits as a function of the relationship of the first clock signal to the second clock signal.

The first delay circuit includes a first variable resistance and the second delay circuit includes a second variable resistance. The resistance of a current path through each of the variable resistances may be independently varied to adjust the delay of the first and second clock signals propagated through the respective first and second delay circuits. The first variable resistance may be controlled with the second clock signal and the second variable resistance may be controlled with the first clock signal. During a transition of the first clock signal, the resistance of the first variable resistance may be increased when the first clock signal is leading the second clock signal. Alternatively, the resistance of the second variable resistance may be increased during transition of the second clock signal when the first clock signal is lagging the second clock signal. Instead of increasing the resistance for the leading clock signal, the resistance of the lagging clock signal may be decreased.

As a result of changes in the resistance of the current path during the transition of the clock signals, the delay experienced by the first and second clock signals propagated through the respective first and second delay circuits may be adjusted. By adjusting the delay, the timing of the delayed first and second clock signals at the output of the self-alignment system may be adjusted to a substantially optimal phase shift. The substantially optimal phase shift may allow the first and second clock signals to intersect during transitions between clock states. The clock states may be a high voltage state and a low voltage state of each of the clock signals. The intersection may occur at about 50% of the high voltage state where the first clock signal is phase shifted by 180 degrees from the second clock signal.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

The present invention includes a self-alignment system for complement clock signals. The self-alignment system provides alignment of the complement clock signals by selectively varying the delay applied to the clock signals. Selective application of delay allows alignment of complement clock signals with respect to each other in a desired phase relationship.

Figure 1:
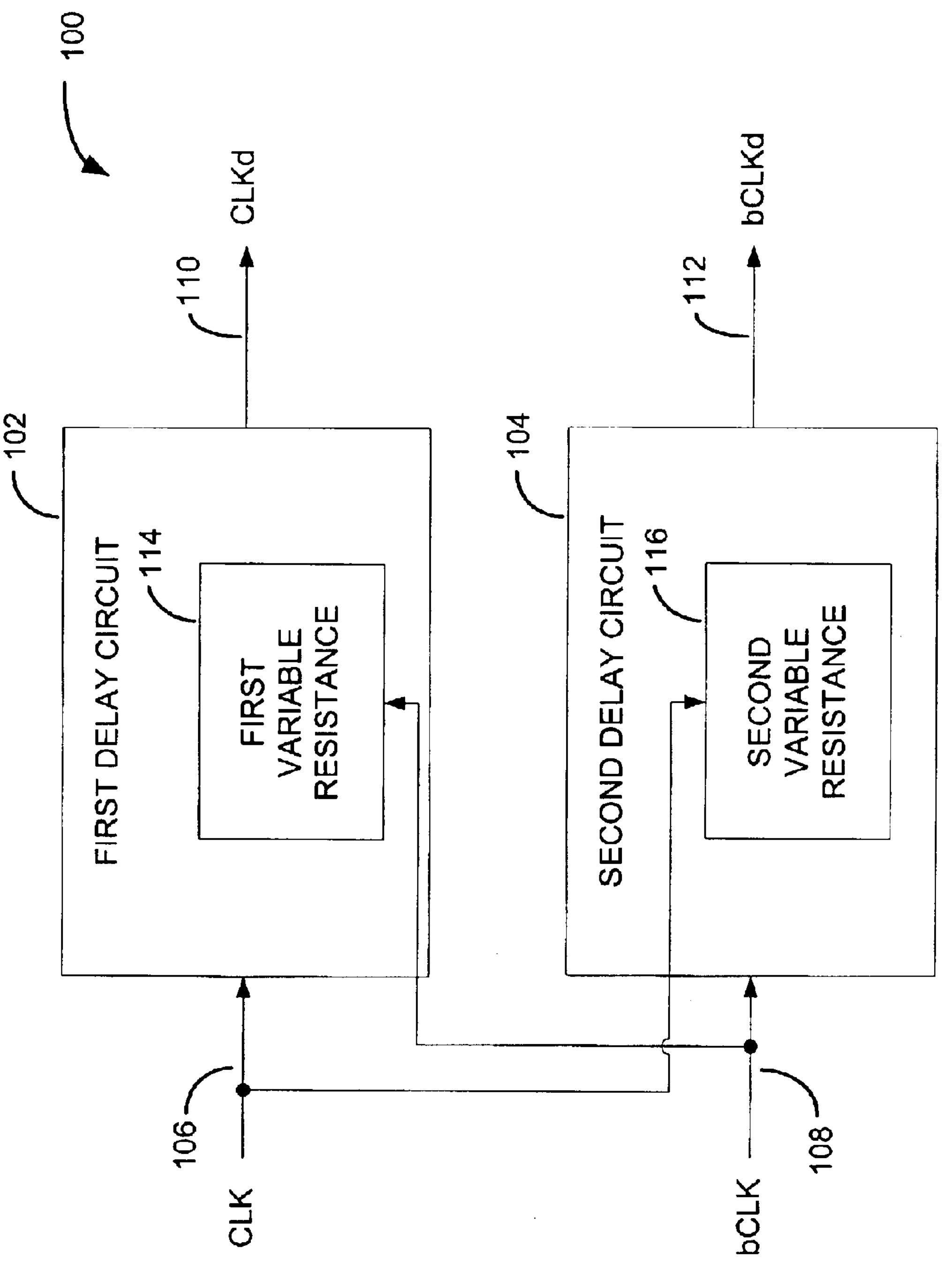
FIG. 1 is a block diagram of an example self-alignment system.

FIG. 1 is a block diagram of a self-alignment system 100. The self-alignment system 100 includes at least one first delay circuit 102 and at least one second delay circuit 104. In other examples any number of delay circuits may be included in the self-alignment system 100.

A first input signal line 106 is coupled with the first delay circuit 102 and the second delay circuit 104. Similarly, a second input signal line 108 is coupled with the second delay circuit 104 and the first delay circuit 102. Also coupled with the first delay circuit 102 is a first output signal line 110, and coupled with the second delay circuit 104 is a second output signal line 112. As used herein, the term "coupled", "connected", or "interconnected" may mean electrically coupled, optically coupled, wirelessly coupled and/or any other form of association providing an interface between systems, devices and/or components.

The first and second delay circuits 102 and 104 may be any device or configuration capable of delaying a respective signal. The first delay circuit 102 includes a first variable resistance 114 that may conduct signals provided as an input to the first delay circuit 102. The second delay circuit 104 includes a second variable resistance 116 that may similarly conduct signals provided as an input to the second delay circuit 104. Signals may be provided as inputs to the first and second delay circuits 102 and 104 on the first and second input signal lines 106 and 108, respectively. In addition, the signal on the first input signal line 106 may be provided to the second variable resistance 116 and the signal on the second input signal line 108 may be provided to the first variable resistance 114. The first and second variable resistances 114 and 116 may be any circuit or device capable of providing a variable resistance as will be hereinafter discussed.

In the illustrated self-alignment system 100, the first signal line 106 may conduct a first clock signal (CLK) and the second signal line 108 may conduct a second clock signal (bCLK). The first and second clock signals (CLK and bCLK) may be complement clock signals. As used herein, the term "complement clock signals" refers to clock signals with substantially the same slew rate and duty cycle that are not in the same phase. The difference in phase may be for example, 90 degrees, 180 degrees, 270 degrees, etc. In the examples that follow, an example phase shift of 180 degrees is used, however the self-alignment system 100 may be modified to align any other phase shift. The complement clock signals may be square waves, sine waves or any other form of clock signals generated with multiple clocks or a single clock.

During operation, the first delay circuit 102 may delay the first clock signal (CLK) to produce a delayed first clock signal (CLKd) on the first output signal line 110. Similarly, the second delay circuit 104 may delay the second clock signal (bCLK) to produce a delayed second clock signal (bCLKd) on the second output signal line 112. Delay of the first and second clock signals (CLK and bCLK) may be independently varied based on the relationship of the first clock signal (CLK) and the second clock signal (bCLK). The delay of the first and second clock signals (CLK and bCLK) may be based on varying the resistance of the first and second variable resistances 114 and 116, respectively.

The first variable resistance 114 may be varied with the second clock signal (bCLK). Similarly, the second variable resistance 116 may be varied with the first clock signal (CLK). Variation of the first and second variable resistances 114 and 116 may adjust the delay and therefore the timing of the first and second clock signals (CLK and bCLK) with respect to each other. As such, the first and second delay circuits 102 and 104 may cooperatively operate to maintain the timing of the first and second clock signals (CLK and bCLK) in a determined phase relationship.

Figure 2:
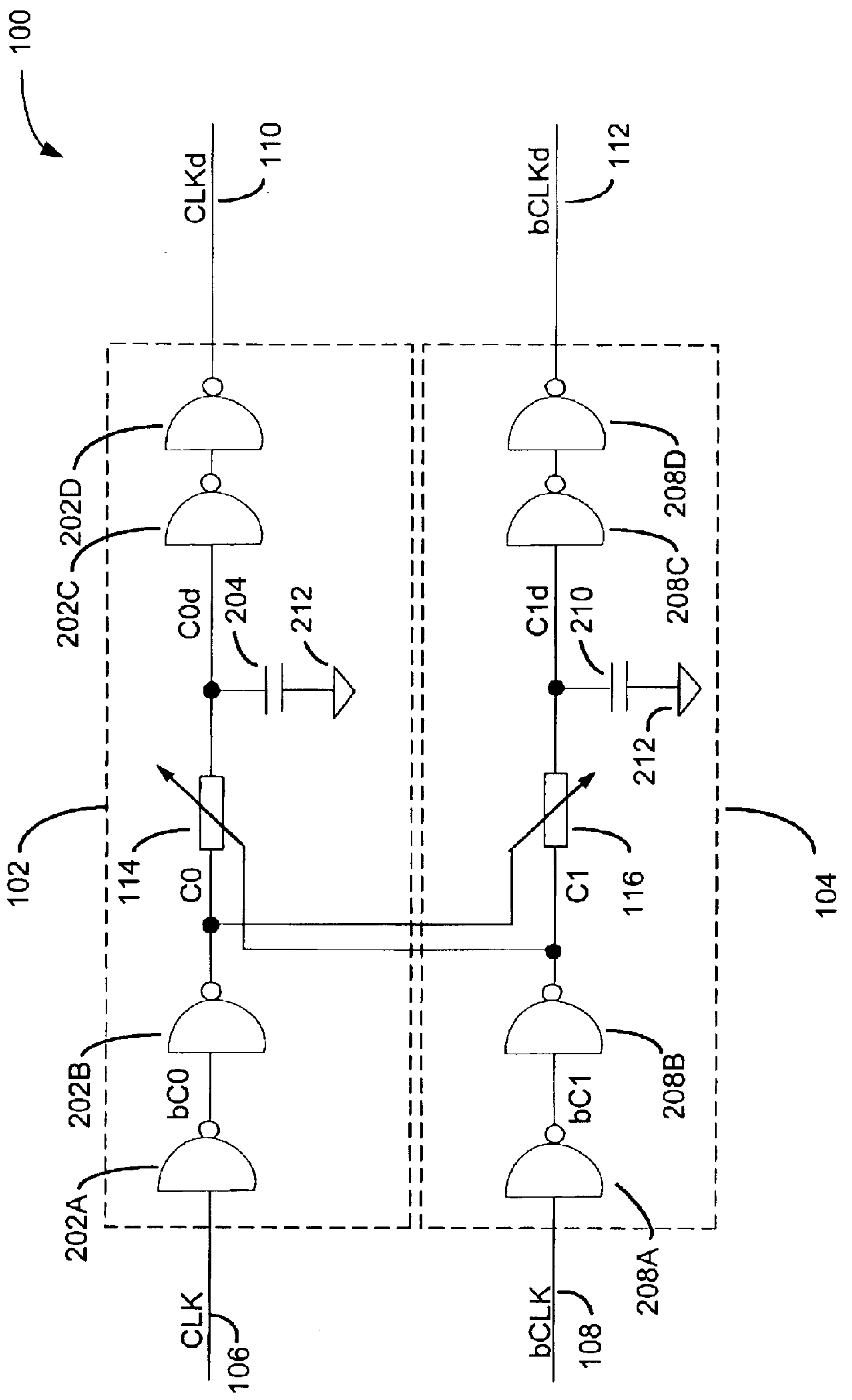
FIG. 2 is a circuit schematic illustrating a more detailed example of the self-alignment system of FIG. 1.

FIG. 2 is an example implementation of the self-alignment system 100 in a digital circuit, such as a DLL circuit in a DDR SDRAM. In this example, the first delay circuit 102 includes a first plurality of inverters 202(*a–d*), the first variable resistance 114 and a first capacitor 204. The second delay circuit 104 similarly includes a second plurality of inverters 208(*a–d*), the second variable resistance 116 and a second capacitor 210. In other examples, any numbers of inverters may be included in the plurality of first and second inverters 202(*a–d*) and 208(*a–d*).

Coupled in series within separate inverter chains formed by the first and second inverters 202(*a–d*) and 208(*a–d*) are the first and second variable resistances 114 and 116, respectively. In the illustrated example, the first variable resistances 114 is coupled in series between first inverters 202*b* and 202*c,* while the second variable resistance 116 is similarly coupled between second inverters 208*b* and 208*c*. The first and second capacitors 204 and 210 are respectively coupled between the variable resistances 114 and 116 and first and second inverters 202*c* and 208*c*. The first and second capacitors 204 and 210 are also coupled with a ground connection 212. In other examples, additional inverters, variable resistances, capacitors and/or inverter chains may be included in the self-alignment system 100.

The illustrated first and second inverters 202(*a–d*) and 208(*a–d*) are a plurality of inverters coupled in series to form the respective inverter chains. In other examples, the first and second inverters 202(*a–d*) and 208(*a–d*) may be any other form of logic capable of transitioning a signal between a logic high state and a logic low state, such as a plurality of NAND gates. The first and second capacitances 204 and 210 may be any appropriate value of capacitance capable of providing a path to the ground connection 212 for transients and other high frequency signals that may be present. In addition, the capacitance of the first and second capacitances 204 and 210 may be designed to cooperatively operate with respective first and second variable resistances 114 and 116 to form an RC element of a determined time constant ($\tau$). As known in the art, the time constant ($\tau$) represents the time in seconds required to charge a capacitor to a percentage of a supply voltage.

Similar to FIG. 1, the first and second clock signals (CLK and bCLK) may be provided on the first input signal line 106 and the second input signal line 108, respectively. Prior to conducting through the first variable resistance 114, the first clock signal (CLK) may propagate through first inverter 202*a* and be inverted to form a first inverted clock signal (bC0). The first inverted clock signal (bC0) may further propagate through first inverter 202*b* to be again inverted and form a first non-inverted clock signal (C0). The first non-inverted clock signal (C0) is similar to the first clock signal (CLK), however propagation through first inverters 202*a* and 202*b* has caused delay of the first clock signal (CLK), and the clock signal is therefore identified as a first non-inverted clock signal (C0). The second clock signal (bCLK) similarly propagates through second inverters 208*a* and 208*b* to form a second inverted clock signal (bC1) and a second non-inverted clock signal (C1), respectively.

The first non-inverted clock signal (C0) may also conduct through the first variable resistance 114 to form a first delayed non-inverted clock signal (C0d). The first delayed non-inverted clock signal (C0d) may further propagate through first inverters 202*c* and 202*d* to eventually form the first delayed clock signal (CLKd) on the first output signal line 110. Similarly, the second non-inverted clock signal (C1) may conduct through the second variable resistance 116 as well as propagating through the second inverters 208*c* and 208*d* to form the second delayed clock signal (bCLKd) on the second output signal line 112.

The resistance of the first variable resistance 114 may be controlled by the second non-inverted clock signal (C1), and the first non-inverted clock signal (C0) may similarly control the resistance of the second variable resistance 116. During operation, the resistance of the first variable resistance 114 or the second variable resistance 116 may be varied to change the amount of delay of the first clock signal (CLK) or the second clock signal (bCLK), respectively.

For example, if the timing of the first clock signal (CLK) is faster than the second clock signal (bCLK), the resistance of the first variable resistance 114 may be increased by the second non-inverted clock signal (C1). By increasing the resistance of the originally faster path (e.g. the first delay circuit 102), the faster clock signal (e.g. the first clock signal (CLK)) will be decelerated more than the clock signal of the originally slower path (e.g. the second clock circuit (bCLK)). As described later, the resistance of the originally slower path (the second delay circuit 104) remains unchanged.

As used herein, the terms "faster" and "slower" refer to the timing relationship between complement clock signals, such as the first and second clock signals (CLK and bCLK). A faster clock signal is a complement clock signal(s) that is leading a slower complement clock signal(s) such that the desired phase shift, or timing, between the complement clock signals is not maintained. Similarly, a slower clock signal is a complement clock signal(s) that is lagging a faster complement clock signal(s).

Figure 3:
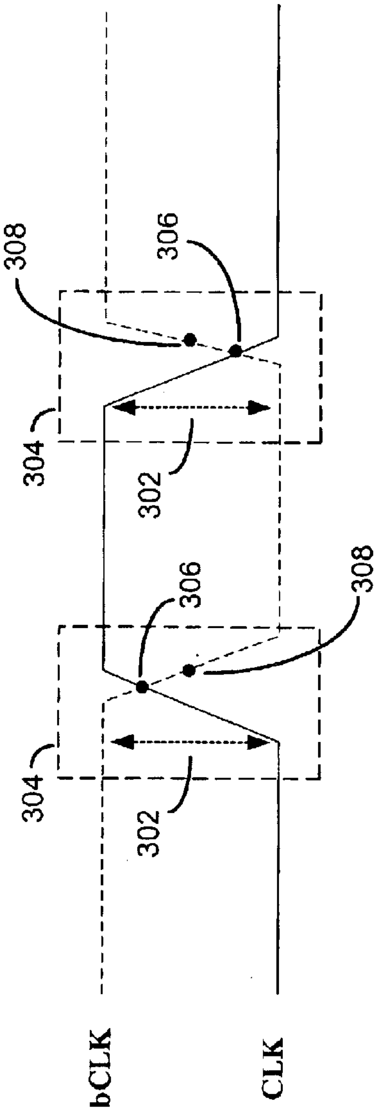
FIG. 3 is an example timing diagram for the first and second clock signals included in FIGS. 1 and 2.

FIG. 3 is an example where the first clock signal (CLK) is supposed to be phase shifted by 180 degrees from the second clock signal (bCLK). In the illustrated example, however, the second clock signal (bCLK) is lagging the first clock signal (CLK) as illustrated by arrows 302. During a transition period 304 when the clock signals (CLK and bCLK) are changing state, the clock signals intersect at an intersection point 306 that is not at a center point 308 of the transition period 304. As illustrated, the timing is such that the first clock signal (CLK) (leading) begins the transition between clock states prior to the second clock signal (bCLK) (lagging) beginning the transition between clock states, thus producing the intersection point 306 that is not centered. If the desired phase shift of the clock signals was maintained at 180 degrees for example, the intersection would be at the center point 308 which is at about 50% of the peak-to-peak voltage of the complement clock signals (CLK and bCLK).

As used herein, the term "clock state" refers to variations in the magnitude of signals output by a clock to develop time-based pulses or other similar timing indications. In the illustrated example, the first clock signal (CLK) is transitioning from a first clock state that is a low voltage state to a second clock state that is a high voltage state and the second clock signal (bCLK) is transitioning from a first clock state that is the high voltage state to a second clock state that is the low voltage state in a first transition 304*a* of the cycle. Similarly, the second clock signal (bCLK) is transitioning from a first clock state that is the low voltage state to a second clock state that is the high voltage state, and the first clock signal (CLK) is transitioning from a first clock state that is the high voltage state to a second clock state that is the low voltage state in a second transition 304*b* of the cycle. In other examples, the sequence and/or number of transitions between clock states during a cycle may be different.

It should also be noted that the magnitude of current associated with the first and second clock signals (CLK and bCLK) varies as a function of the transitions between the clock states. During either the low or high voltage state, the current of the first or second clock signals (CLK or bCLK) remains low. During transitions between the clock states however, the current of the first or second clock signals (CLK or bCLK) increases, and may therefore be affected by varying resistance.

Figure 4:
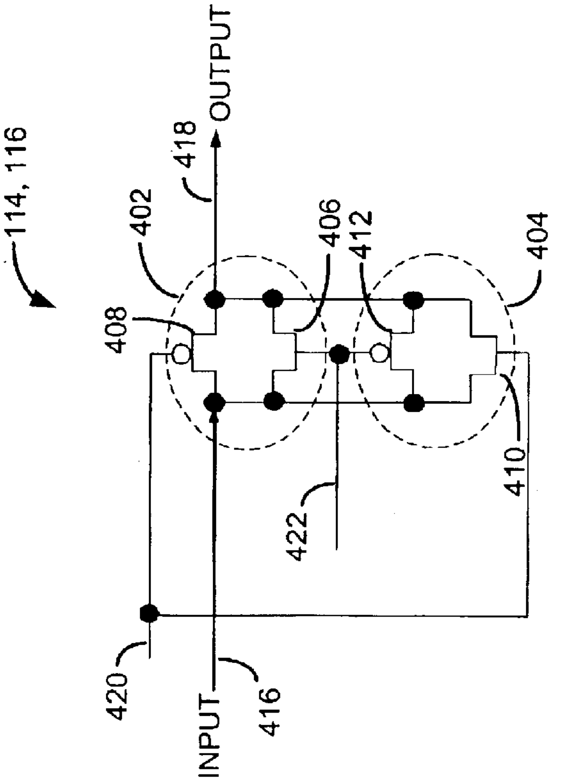
FIG. 4 is circuit schematic of an example variable resistance illustrated in FIGS. 1 and 2.

FIG. 4 is an example circuit diagram representative of one of the first and second variable resistances 114 and 116 illustrated in FIG. 2. In this example the first and second variable resistances 114 and 116 are voltage controlled resistances implemented in a technology such as complimentary metal oxide semiconductor (CMOS) technology. Other examples of variable resistance such as current controlled resistance as well as other implementations such as other metal oxide semiconductor technologies or any other technology may be implemented in other examples.

The illustrated variable resistance circuit 114 or 116 includes a first transfer gate 402 coupled in parallel with a second transfer gate 404. The first transfer gate 402 includes a first nMOS transistor 406 coupled in parallel with a first pMOS transistor 408. The second transfer gate 404 similarly includes a second nMOS transistor 410 coupled in parallel with a second pMOS transistor 412.

An input signal provided on an input signal line 416 may be conducted through the variable resistance circuit 114 or 116 by one of the first and second transfer gates 402 and 404 to an output signal line 418. Activation and deactivation of the first and second transfer gates 402 and 404 are opposite based on a first control signal provided on a first control line 420 and a second control signal provided on a second control line 422. In other words, when one of the first and second transfer gates 402 and 404 is activated the other of the first and second transfer gates 402 and 404 (the counterpart) is deactivated. In the illustrated example, the first and second control signals may be logically opposite such that both transistors 406 and 408 of the first transfer gate 402 and both transistors 410 and 412 of the second transfer gate 404 are activated or deactivated together.

When either of the first and second transfer gates 402 and 404 is activated, a low-resistance current path is provided to conduct the input signal from the input signal line 416 to the output signal line 418. During a transition period when the first and second transfer gates 402 and 404 are both passing between the activated and the deactivated states, however, a high-resistance current path is provided by the variable resistance circuit 114 or 116 to conduct the input signal from the input signal line 416 to the output signal line 418.

Figure 5:
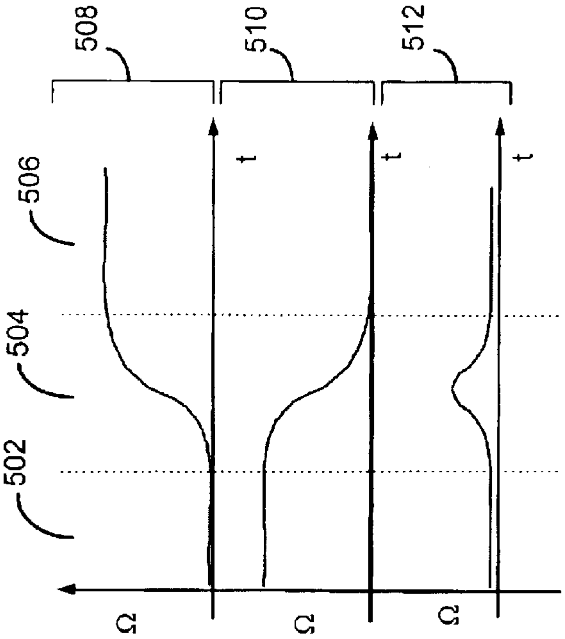
FIG. 5 is a series of timing diagrams illustrating example operation of the variable resistance circuit illustrated in FIG. 4.

FIG. 5 is a series of example timing diagrams illustrating the resistance of the first and second transfer gates 402 and 404 of FIG. 4 during the various operational stages of the variable resistance circuit 114 or 116. The timing diagram includes a first stage 502, a transition stage 504 and a second stage 506. A first timing diagram 508 depicts the resistivity of the first transfer gate 402 and a second timing diagram 510 depicts the resistivity of the second transfer gate 404. The resistivities are depicted in ohms (Ω) with respect to time (t) within each of the stages 502, 504 and 506. A third timing diagram 512 illustrates the resistance in ohms experienced by the input signal conducted through the variable resistance circuit 114 or 116 from the input signal line 416 to the output signal line 418 during each of the stages 502, 504 and 506.

In the illustrated example, during the first stage 502, the first transfer gate 402 is activated by a logic low signal on the first control line 420 and logic high signal on the second control line 422. Accordingly, the first transfer gate 402 is conducting to provide a relatively low resistance current path for the input signal as illustrated in the first timing diagram 508. The second transfer stage 404 is therefore deactivated by the signals on the first and second control lines 420 and 422 and is providing a relatively high resistance current path for the input signal as illustrated in the second timing diagram 510. The resulting low resistance current path experienced by the input signal being conducted through the variable resistance circuit 114 or 116 as illustrated in the third timing diagram 512 is due to the relatively low resistance of first transfer gate 402.

To initiate the transition stage 504, the first control signal on the first control line 420 goes to a logic low state and the second control signal on the second control line goes to a logic high state. As a result, the first transfer gate 402 begins the transition to a deactivated (or high resistance) state and the second transfer gate 404 begins the transition to an activated (or low resistance) state as illustrated in the first and second timing diagrams 508 and 510, respectively. During this transition, all of the transistors 406, 408, 410 and 412 are in saturation. The saturation of all the transistors 406, 408, 410 and 412 during the transition stage 504 results in an increase in the current path resistance experienced by the input signal conducted through the variable resistance circuit 114 or 116 as illustrated in the third timing diagram 512. The increase in current path resistance may increase the delay of the input signal in conducting through the variable resistance circuit 114 or 116.

When the first and second transfer gates 402 and 404 complete the transition to the opposite state, the third stage 506 begins. Within the illustrated third stage 506, the resistance of the first transfer gate 402 is relatively high (non-conducting/deactivated) and the resistance of the second transfer gate is relatively low (conducting/activated) as illustrated in the first and second timing diagrams 508 and 510. The resulting current path resistance experienced by the input signal conducted through the variable resistance circuit 114 or 116 is relatively low as illustrated in the third timing diagram 512 due to the relatively low resistance of the activated second transfer gate 404.

Figure 6:
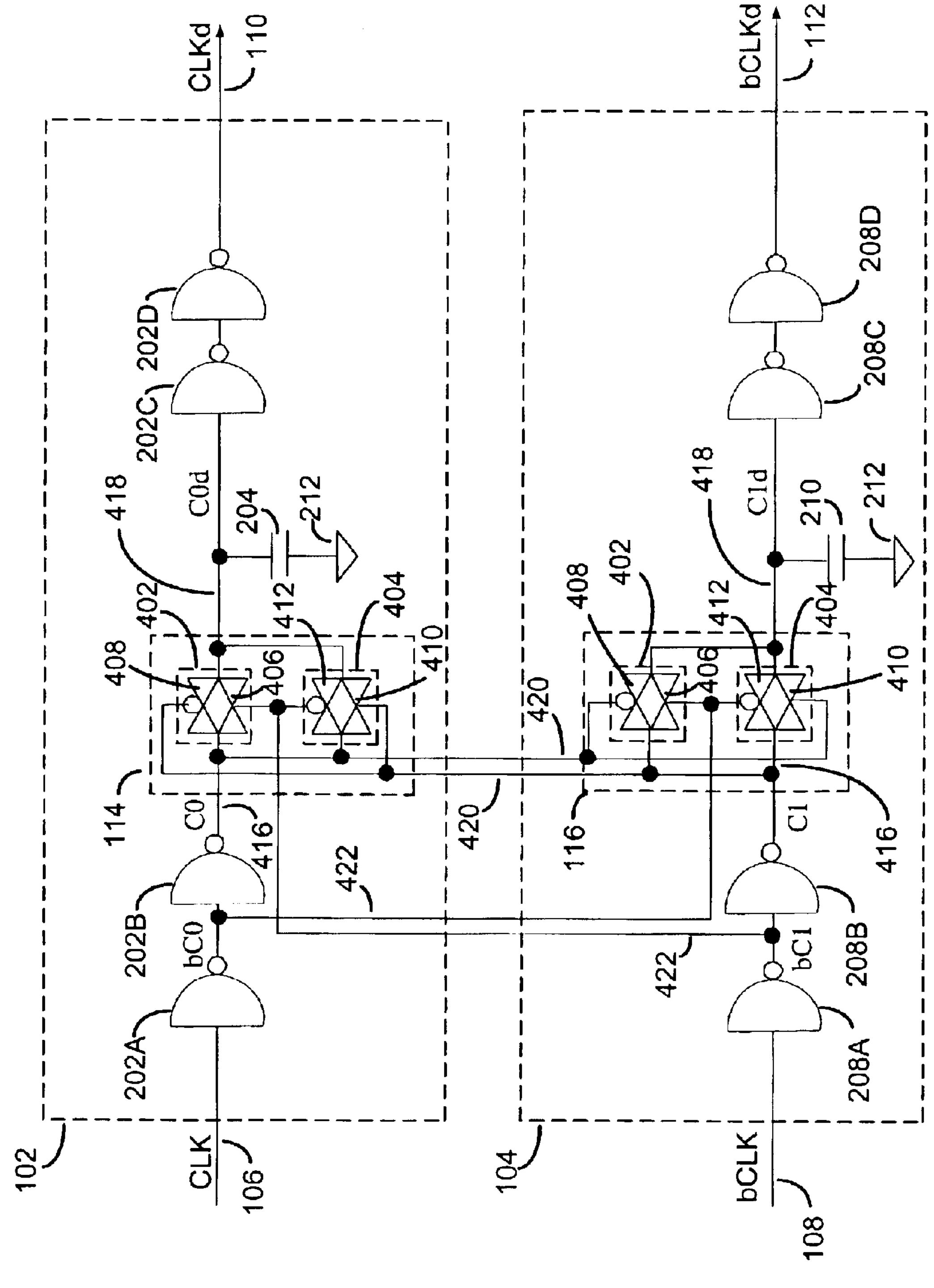
FIG. 6 is a circuit schematic of another example of the self-alignment system illustrated in FIG. 1.

FIG. 6 is another example of the self-alignment system 100 of FIG. 1 that includes the first delay circuit 102 and the second delay circuit 104. Within the first and second delay circuits 102 and 104 are included the variable resistance circuits 114 and 116, respectively that were previously discussed with reference to FIGS. 4 and 5. Similar to FIG. 2, the first and second delay circuits 102 and 104 each include a respective plurality of inverters 202(*a–d*) and 208(*a–d*) formed in an inverter chain, and respective capacitors 204 and 210 coupled with the inverter chains and the ground connection 212.

As previously discussed, the respective first and second clock signals (CLK and bCLK) may be provided on the respective first and second input signal lines 106 and 108. The respective first and second clock signals (CLK and bCLK) may be propagated through the respective first and second delay circuits 102 and 104 to result in respective first and second delayed clock signals (CLKd and bCLKd) on respective first and second output signal lines 110 and 112.

As further illustrated in FIG. 6, the input signal line 416 of the first variable resistance 114 is coupled with first inverter 202*b* and the output signal line 418 is coupled with first inverter 202*c*. Similarly, the input and output signal lines 416 and 418 of the second variable resistance 116 are respectively coupled with second inverters 208*b* and 208*c*. In addition, the first inverted clock signal (bC0) of the first delay circuit 102 is provided as the second control signal on the second control line 422 of the second variable resistance 116. The second control line 422 is coupled between first inverter 202*a* and first inverter 202*b*. In addition, the second control line 422 is coupled with the gates of the first nMOS transistor 406 in the first transfer gate 402 and the second pMOS transistor 412 in the second transfer gate 404 of the second variable resistance 116.

Similarly, the second control line 422 of the first variable resistance 114 is coupled between second inverter 208*a* and second inverter 208*b* to provide inverted clock signal (bC1) as the second control signal to the gates of the first nMOS transistor 406 and the second pMOS transistor 412 of the first variable resistance 114. The first control line 420 of the first variable resistance 114 is coupled with the output of first inverter 208*b* to provide the second non-inverted clock signal (C1) as the first control signal. The first non-inverted clock signal (C0) is similarly provided as the first control signal on the first control line 420 of the second variable resistance 116.

Figure 7:
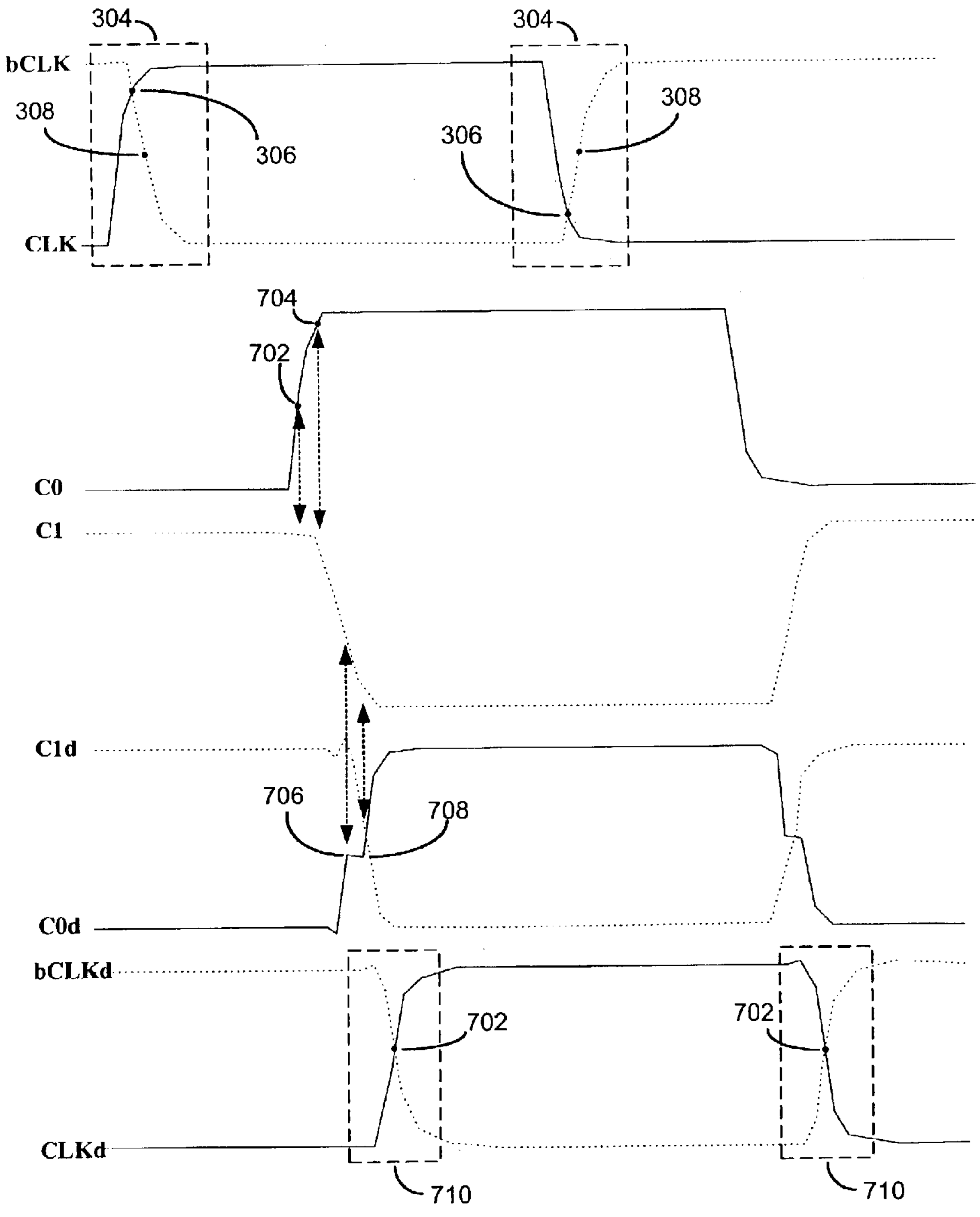
FIG. 7 is a timing diagram illustrating example operation of the self-alignment system depicted in FIG. 6.

FIG. 7 is a timing diagram depicting example operation of the self-alignment system 100 of FIG. 6. In this example, the first and second clock signals (CLK and bCLK) are complement clock signals that should be in a 180 degree phase shift relationship. As illustrated, the first clock signal (CLK) is initially in a low voltage state (logic low) and the second clock signal (bCLK) is initially in a high voltage state (logic high).

As in FIG. 3, the first clock signal (CLK) is leading the second clock signal (bCLK) when provided to the first and second delay circuits 102 and 104 on the respective first and second input signal lines 106 and 108. Accordingly, during the transition period 304, the intersection point 306 is not at the center point 308 of the transition period 304. Following propagation of the first and second clock signals (CLK and bCLK) through respective first inverters 202*a* and 202*b* and second inverters 208*a* and 208*b*, respective first non-inverted clock signal (C0) is still leading second non-inverted clock signal (C1) as illustrated.

As previously discussed, the first and second inverted clock signals (bC0 and bC1) and the first and second non-inverted clock signals (C0 and C1) are the control signals controlling the variable resistance of the second and first variable resistances 116 and 114, respectively. Since the first inverted and non-inverted clock signals (bC0 and C0) are faster, the state change of the transistors 406, 408, 410 and 412 occurs first in the second variable resistance 116. As previously discussed with reference to FIG. 5, during the transition stage 504, the resistance of the current path that is experienced by the second non-inverted clock signal (C1) conducting through the second variable resistance 116 will be highest at a center point 702 of the state change of the first non-inverted clock (C0).

The second non-inverted clock signal (C1), however has not began the transition to the low voltage state. Since there is little current flow in the second non-inverted clock signal (C1), the increased resistance does not increase the delay of the second non-inverted clock signal (C1) in conducting through the second variable resistance 116. By the time the second non-inverted clock signal (C1) begins the change in state from the high voltage state to the low voltage state, and thus the period of high clock signal current, the transition of first non-inverted clock signal (C0) is at a transition point 704. The high resistance of the current path through the second variable resistance 116 that was present during the transition stage 504 (FIG. 5) has therefore already decreased. As a result, the second non-inverted clock signal (C1) conducted through the second variable resistance 116 experiences little additional delay in forming the second delayed non-inverted clock signal (C1d) as illustrated.

It should be noted that there will be a delay equal to the propagation time of the inverted clock signal (bC0) through first inverter 202_b_ before both the first and second control signals are set. To eliminate the effects of this delay, the propagation delay of both first inverter 202_b_ and second inverter 208_b_ may be made equal or smaller than the time constant (τ) of the RC element formed with the respective first and second variable resistances 114 and 116 and respective capacitors 204 and 210. In addition, the time constant (τ) of the RC element may be made larger than the potential mismatch between the desired phase shift and the actual phase shift between the first and second clock signals (CLK and bCLK).

The second non-inverted clock signal (C1), however, is near the middle of the transition from the high voltage state to the low voltage state when the first delayed non-inverted clock signal (C0d) is transitioning from the low voltage state to the high voltage state. Since the second inverted and non-inverted clock signals (bC1 and C1) control the resistance of the first variable resistance 114, the first variable resistance 114 is therefore within the transition stage 504 (FIG. 5). Accordingly, the relatively high resistance of the current path of the first variable resistance 114 is experienced by the first non-inverted clock signal (C0) during the period of high current flow. The high resistance essentially stops propagation of the first non-inverted clock signal (C0) through the first variable resistance 114. As a result, at a start delay point 706 of the transition from the low voltage state to the high voltage state, the first non-inverted clock signal (C0) is delayed.

When the transistors 406, 408, 410 and 412 leave saturation at the end of the transition stage 504 (FIG. 5), the resistance of the current path through the first variable resistance 114 again becomes relatively low at an end delay point 708 as the second non-inverted clock signal (C1) reaches the low voltage state. When the resistance of the current path of the first variable resistance 114 again goes low, the first non-inverted clock signal (C0) is allowed to propagate through the first variable resistance 114 and form the delayed non-inverted clock signal (C0d). The first delayed non-inverted clock signal (C0d) may then propagate through respective inverters 202_c_ and 202_d_ to provide the first delayed clock signal (CLKd).

Meanwhile, the second delayed non-inverted clock signal (C1d) may propagate through respective inverters 208_c_ and 208_d_ to provide the second delayed clock signal (bCLKd). As further illustrated in FIG. 7, during a transition period 710 of the first and second delayed clock signals (CLKd and bCLKd), intersection occurs at substantially the center of the transition period 710. In other words, the intersection occurs at substantially 50% of the peak-to-peak voltage of the clock signals (CLKd and bCLKd), thus maintaining the second delayed clock signal (bCLKd) phase shifted by about 180 degrees from the first delayed clock signal (CLKd). As such, during each cycle of the first and second clock signals (CLK and bCLK) the delay may be selectively adjusted twice, once during each transition period.

Figure 8:
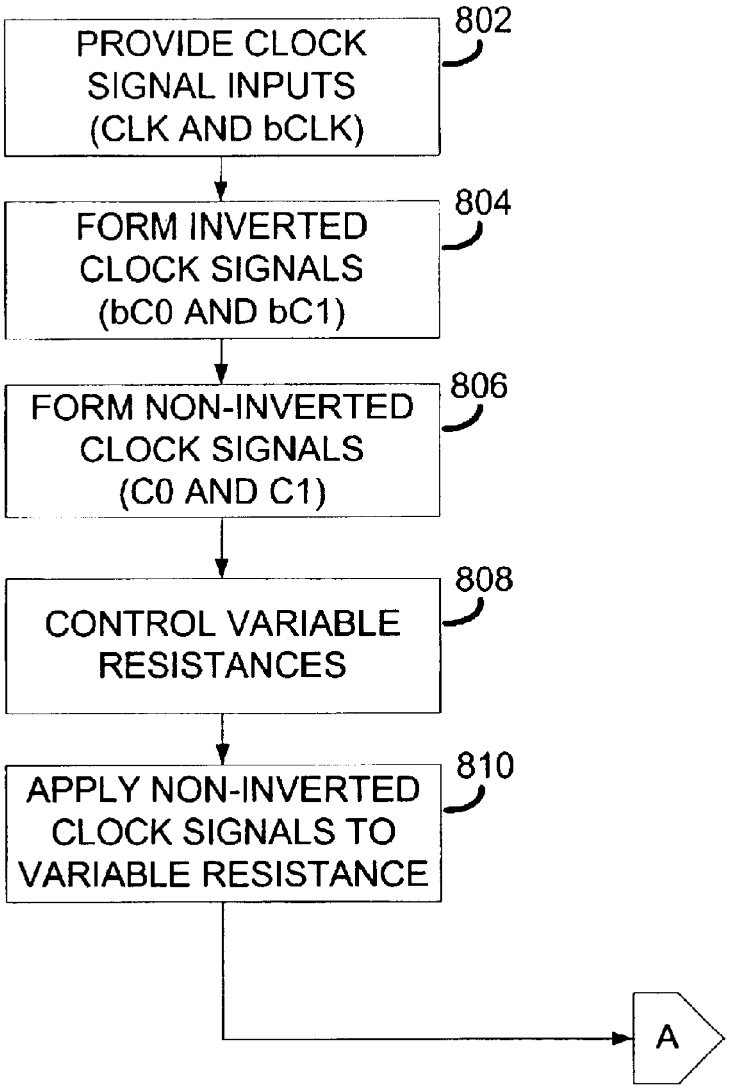
FIG. 8 is a process flow diagram illustrating example operation of the self-alignment system of FIG. 6.

FIG. 8 is a process flow diagram illustrating example operation of the self-alignment system 100 previously discussed with reference to FIGS. 6–7. The operation begins at block 802 when complement first and second clock signals (CLK and bCLK) are provided as inputs to the self-alignment system 100 on the respective first and second clock signals lines 106 and 108. At block 804, the first and second input signals (CLK and bCLK) propagate with delay through respective first and second inverters 202_a_ and 208_a_ to form the first and second inverted clock signals (bC0 and bC1), respectively.

The first and second inverted clock signals (bC0 and bC1) are further propagated with delay through respective first and second inverters 202_b_ and 208_b_ to form the first and second non-inverted clock signals (C0 and C1), respectively at block 806. At block 808, the first and second inverted clock signals (bC0 and bC1) and the first and second non-inverted clock signals (C0 and C1) are provided as respective first and second control signals on respective first and second control lines 420 and 422 to control the respective second and first variable resistances 116 and 114. The first and second non-inverted clock signals (C0 and C1) are also applied to the respective input lines 416 of the first and second variable resistances 114 and 116 at block 810.

Figure 9:
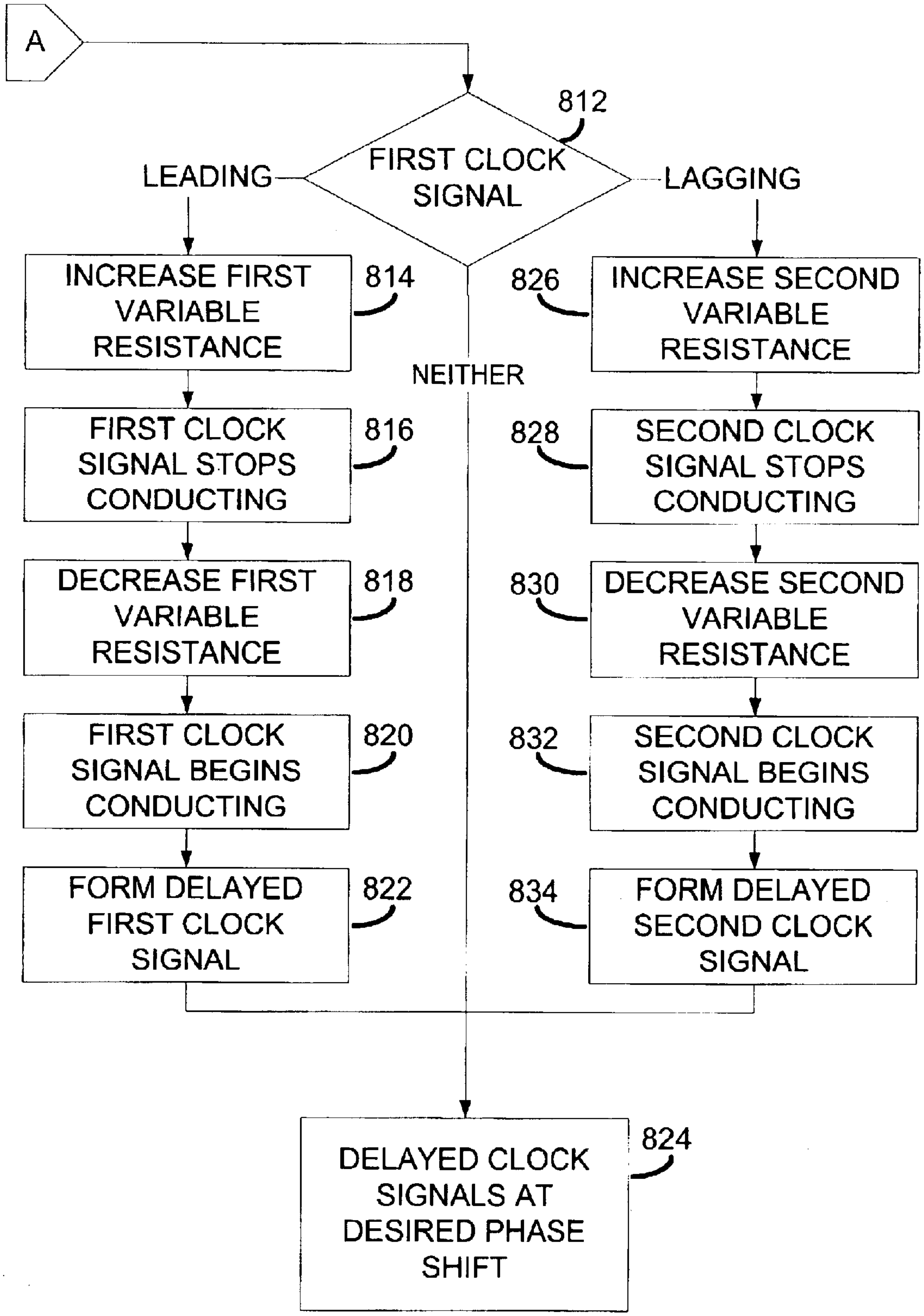
FIG. 9 is a second portion of the flow diagram illustrated in FIG. 8.

Referring now to FIG. 9, at block 812, the phase relationship of the first clock signal (CLK) and the second clock signal (bCLK) are used to control the first and second variable resistances 114 and 116. Where the first clock signal (CLK) is leading the second clock signal (bCLK) (e.g. faster), the resistance of the current path through the first variable resistance 114 is increased during the transition of the second non-inverted clock signal (C1) at block 814. At block 816, the first non-inverted clock signal (C0) is stopped from conducting through the first variable resistance 114 since the first non-inverted clock signal (C0) is also in transition.

After an appropriate delay, the resistance of the current path of the first variable resistance 114 is again decreased at block 818. At block 820, the first non-inverted clock signal (C0) is allowed to conduct through the first variable resistance 114 and form the first delayed non-inverted clock signal (C0d). The first delayed non-inverted clock signal (C0d) is propagated through the first inverters 202_c_ and 202_d_ to form the first delayed clock signal (CLKd) at block 822. At block 824, the timing of the first delayed clock signal (CLKd) and the second delayed clock signal (bCLKd) are at the desired phase shift of 180 degrees. Accordingly, during transitions, the first delayed clock signal (CLKd) and the second delayed clock signal (bCLKd) intersect at the center point 702 of the transition period 710.

Referring again to block 812, when the first clock signal (CLK) is lagging the second clock signal (bCLK) (e.g. slower), the resistance of the current path through the second variable resistance 116 is increased during the transition of the first non-inverted clock signal (C0) at block 826. At block 828, the second non-inverted clock signal (C1) is stopped from conducting through the second variable resistance 116 since the second non-inverted clock signal (C1) is also in transition. After appropriate delay, the resistance of the current path of the second variable resistance 116 is lowered at block 830. At block 832, the second non-inverted clock signal (C1) is allowed to conduct through the second variable resistance 116 and form the second delayed non-inverted clock signal (C1d). The second delayed non-inverted clock signal (C1d) is propagated through second inverters 208_c_ and 208_d_ to form the second delayed clock signal (bCLKd) at block 834. The timing of the first delayed clock signal (CLKd) and the second delayed clock signal (bCLKd) are again at the desired phase shift of 180 degrees at block 824.

Referring again to block 812, when the first clock signal (CLK) is neither lagging nor leading the second clock signal (bCLK) (e.g. neither faster nor slower) the clock signals are delayed by the same amount, and thus the first and second delayed clock signal (CLKd and bCLKd, respectively) are at the desired phase shift of 180 degrees at block 824.

The previously discussed self-alignment system 100 may be used to correct mismatches in the desired phase relationship between complement clock signals. By selectively increasing the variable resistance through which the complement clock signals are independently conducted, the delay in propagation of one of the complement clock signals may be adjusted. By adjusting the delay of one of the complement clock signals, the phase relationship of the complement clock signals may be optimally adjusted to maintain a desired phase shift between the complement clock signals.

While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A self alignment system for complement clock signals, the self alignment system comprising:

a first delay circuit operable to delay a first clock signal; and a second delay circuit operable to delay a second clock signal that is out of phase with the first clock signal, wherein the delay of the first and second clock signals is independently variable as a function of the relationship of the first clock signal to the second clock signal, and wherein each of the first and second delay circuits includes a variable resistance and a capacitor coupled between a plurality of inverters.

2. The self alignment system of claim 1, wherein delay with the first delay circuit is variable as a function of the second clock signal and delay with the second delay circuit is variable as a function of the first clock signal.

3. The self alignment system of claim 1, wherein independent delay of the first and second clock signals are variable during transitions of the first and second clock signals between clock states.

4. The self alignment system of claim 1, wherein the first and second delay circuits are operable to adjust the timing of the respective first and second clock signals to maintain the first clock signal phase shifted by about 180 degrees from the second clock signal.

5. The self alignment system of claim 1, wherein the first and second delay circuits are operable to adjust the timing of the respective first and second clock signals to intersect during transitions of the first and second clock signals between clock states that are a high voltage state and a low voltage state.

6. The self alignment system of claim 1, wherein the first and second delay circuits are operable so adjust the timing of the respective first and second clock signals to cross at the corner of a transition period.

7. The self alignment system of claim 1, wherein the first and second delay circuits are operable to adjust the timing of transitions of the respective first and second clock signals to intersect at about 50% of the peak to peak voltage of the first and second clock signals.

8. The self alignment system of claim 1, wherein the first and second delay circuits are operable to selectively adjust the timing of the respective first and second clock signals twice during each cycle of the first and second clock signals.

9. A self alignment system for complement clock signals, the self alignment system comprising:

a first variable resistance operable to conduct a first clock signal; and a second variable resistance operable to conduct a second clock signal, wherein the first clock signal is operable to vary the resistance of the second variable resistance, and the second clock signal is operable to vary the resistance of the first variable resistance to selectively adjust delay of the respective first and second clock signals, and wherein the first and second variable resistances each include a first transfer gate and a second transfer gate.

10. The self alignment system of claim 9, wherein the first and second variable resistances each comprise a plurality of paralleled transistors.

11. The self alignment system of claim 9, wherein resistance of the first and second variable resistances are respectively increased to increase the delay of the respective first and second clock signals.

12. The self alignment system of claim 9, wherein resistance of the first and second variable resistances is respectively increased during a transition between clock states of the respective first and second clock signals to increase respective delay.

13. The self alignment system of claim 9, wherein the first and second variable resistances are increased outside of a transition of the first and second clock signals between clock states to avoid increasing delay.

14. The self alignment system of claim 9, wherein the first and second variable resistances each include a plurality of transistors, the resistance of the first and second variable resistances independently variable as a function of transition of the transistors between an activated and a deactivated state.

15. The self alignment system of claim 9, further comprising a plurality of inverter chains, wherein the first and second variable resistances are each coupled with one of the inverter chains.

16. A method of aligning complement clock signals, the method comprising:

applying a first complement clock signal to a first variable resistance that is operable to conduct the first complement clock signal;

applying a second complement clock signal to a second variable resistance that is operable to conduct the second complement clock signal;

wherein the first and second variable resistances each include a first transfer gate and a second transfer gate;

increasing the first variable resistance during a transition of the first complement clock signal when the first complement clock signal is leading the second complement clock signal; and increasing the second variable resistance during a transition of the second complement clock signal when the first complement clock signal is lagging the second complement clock signal.

17. The method of claim 16, wherein increasing the first variable resistance comprises controlling the first variable resistance with the second complement clock signal.

18. The method of claim 16, wherein increasing the second variable resistance comprises controlling the second variable resistance with the first complement clock signal.

19. The method of claim 16, wherein increasing one of the first and second variable resistances comprises activating the first transfer gate and deactivating the second transfer gate included in each of the first and second variable resistances at the same time.

20. The method of claim 16, wherein increasing one of the first and second variable resistances comprises turning a first transistor off while turning a second transistor on.

21. The method of claim 16, further comprising increasing the second variable resistance outside of the transition period of the second complement clock signal when the first complement clock signal is leading the second complement clock signal.

22. The method of claim 16, further comprising increasing the first variable resistance outside of the transition period of the first complement clock signal when the first complement clock signal is lagging the second complement clock signal.

23. The self alignment system of claim 1, wherein the delay of the first clock signal is variable as a function of the second clock signal and the delay of the second clock signal is variable as a function of the first clock signal.

24. The self alignment system of claim 1, wherein the delay of the first clock signal is independently variable with respect to the delay of the second clock signals.

25. The self alignment system of claim 1, wherein the delay of each of the first and second clock signals is variable to adjust a desired phase shift between the first and second clock signals.

26. The self alignment system of claim 1, wherein the delay of the first clock signal is variable as a function of the second clock signal and the delay of the second clock signal is variable as a function of the first clock signal, and the delay of the first and second clock signals are variable with respect to each other to adjust a desired phase shift between the first and second clock signals.

27. The self alignment system of claim 9, wherein the delay of the first and second clock signals is selectively adjustable to adjust a phase shift between the first and second clock signals.

28. The method of claim 16, wherein the first variable resistance and the second variable resistance are increased to adjust a phase shift between the first and second clock signals.

* * * * *

UNITED STATES PATENT AND TRADEMARK OFFICE

CERTIFICATE OF CORRECTION

PATENT NO. : 6,946,889 B2
DATED : September 10, 2005
INVENTOR(S) : Thoai-Thai Le, George Alexander and Guenter Gerstmeier It is certified that error appears in the above-identified patent and that said Letters Patent is hereby corrected as shown below:

<u>Column 13,</u>
Line 20, change “signals” to -- signal --.

Signed and Sealed this

Thirteenth Day of December, 2005

JON W. DUDAS
*Director of the United States Patent and Trademark Office*